United States Patent
Furuta et al.

(10) Patent No.: US 8,154,917 B2
(45) Date of Patent: Apr. 10, 2012

(54) MAGNETIC STORAGE DEVICE

(75) Inventors: Masanori Furuta, Mishima (JP);
Daisuke Kurose, Kawasaki (JP);
Tsutomu Sugawara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/039,633

(22) Filed: Mar. 3, 2011

(65) Prior Publication Data

US 2011/0149640 A1 Jun. 23, 2011

Related U.S. Application Data (62) Division of application No. 12/343,353, filed on Dec. 23, 2008, now abandoned.

(30) Foreign Application Priority Data

Feb. 29, 2008 (JP) .................................. 2008-050566

(51) Int. Cl.
*G11C 11/14* (2006.01)
(52) U.S. Cl. .................... 365/171; 365/158; 365/189.07; 365/189.09; 365/189.15; 365/189.16; 365/209; 365/210.1
(58) Field of Classification Search .................. 365/158, 365/171, 189.07, 189.09, 189.15, 189.16, 365/209, 210.1
See application file for complete search history.

(56) References Cited

U.S. PATENT DOCUMENTS

| | | | |
|---|---|---|---|
| 6,741,490 B2 | 5/2004 | Baker | |
| 6,947,318 B1 * | 9/2005 | Fujita | 365/173 |
| 7,102,913 B2 | 9/2006 | Nazarian | |
| 7,102,945 B2 | 9/2006 | Tsuchida et al. | |
| 7,116,598 B2 * | 10/2006 | Shimizu et al. | 365/210.1 |
| 7,388,788 B2 * | 6/2008 | Honda | 365/185.21 |
| 2007/0285975 A1 * | 12/2007 | Kawahara et al. | 365/158 |

* cited by examiner

*Primary Examiner* — Pho M Luu
*Assistant Examiner* — Thao Bui
(74) *Attorney, Agent, or Firm* — Finnegan, Henderson, Farabow, Garrett & Dunner, L.L.P.

(57) ABSTRACT

A magnetic storage device includes a plurality of MRAM memory cells connected to a data transfer line, a clamp transistor connected between the data transfer line and a reading signal line and configured to fixedly hold the potential of the data transfer line, and a reading circuit which is connected to the reading signal line and which reads the storage information of the memory cell. The reading circuit includes a hold switch connected between the reading signal line and a reading node N and configured to hold the potential of the node N, a capacitor connected between the node N and a ground end, a precharging switch connected between the node N and a power source and configured to charge the capacitor, and an inverter to which the potential of the node N is input to generate a digital signal.

7 Claims, 7 Drawing Sheets

MAGNETIC STORAGE DEVICE

CROSS-REFERENCE TO RELATED APPLICATIONS

This application is a divisional of and claims the benefit of priority of U.S. application Ser. No. 12/343,353, filed Dec. 23, 2008 now abandoned, which is based upon and claims the benefit of priority from prior Japanese Patent Application No. 2008-050566, filed Feb. 29, 2008, the entire contents of each of which are incorporated herein by reference.

BACKGROUND OF THE INVENTION

1. Field of the Invention

The present invention relates to a magnetic storage device in which a reading circuit for reading storage information from a memory cell formed using a magnetic material is improved.

2. Description of the Related Art

In recent years, much attention has been paid to a magnetic storage device using a magneto-resistance random access memory (MRAM) cell in which a resistance value changes in accordance with storage information.

In a reading circuit which reads the signal of this type of MRAM cell, the output current of the MRAM cell is supplied to a resistor, and the output current is converted into a voltage. Then, this voltage value is compared with a reference value by a comparison circuit, to judge the storage state of the MRAM cell. The output current of the MRAM cell is a micro value of about several hundred μA. To correctly judge the storage state by the comparison circuit, the micro current value of the MRAM cell needs to be converted into a comparatively large voltage value of about several hundred mV. Therefore, a large resistance value is necessary. To realize this large resistance value, a large area is necessary, which is a problem in integration.

As a method for solving this problem, a conversion method by capacity discharge using a capacitor has been suggested (U.S. Pat. No. 6,741,490, Micron Technology, May, 2004). This method utilizes properties that the voltage changes in accordance with the amount of electric charges accumulated in the capacitor. Furthermore, the voltage value of a capacity end due to a reference current is compared with that of a capacity end due to a cell current, to read the signal of the cell. In this method, a large resistance for the current-voltage conversion can be realized with a micro capacity, to decrease the area for the voltage conversion.

However, in the reading circuit of the capacity discharge system, a complicated voltage comparison circuit for detecting the signal and a latch circuit which holds the comparison result are necessary. To constitute these circuits, a large number of transistors need to be used, which is a cause to bring about the increase of the area and the increase of power consumption.

BRIEF SUMMARY OF THE INVENTION

According to one aspect of the present invention, there is provided a magnetic storage device comprising:
 a data transfer line;
 a plurality of memory cells connected to the data transfer line, each of the memory cells being comprising of a magnetic material;
 a reading signal line which reads a signal from the data transfer line;
 a clamp transistor connected between the reading signal line and the data transfer line, the transistor being provided with a control input terminal to which a clamp voltage is supplied to fixedly hold a potential of the data transfer line;
 a reading node which reads the signal from the reading signal line;
 a hold switch connected between the reading node and the reading signal line;
 a capacitor connected between the reading node and a ground end;
 a precharging switch connected between the reading node and a power source; and
 an inverter to which a potential of the reading node is input to generate a digital signal.

According to another aspect of the present invention, there is provided a magnetic storage device comprising:
 a data transfer line;
 a plurality of memory cells connected to the data transfer line, each of the memory cells comprising a magnetic change type resistance element in which an electric resistance changes in accordance with a magnetized state and a selection transistor, which are connected in series;
 a reading signal line which reads a signal from the data transfer line;
 a clamp transistor connected between the reading signal line and the data transfer line, the transistor being provided with a control input terminal to which a clamp voltage is supplied to fixedly hold a potential of the data transfer line;
 a reading circuit which reads the signal from the data transfer line, the reading circuit including:
  a reading node which reads the signal from the reading signal line;
  a hold switch connected between the reading node and the reading signal line, controlled by a reading control signal $\phi r$ and configured to hold a potential of the reading node;
  a capacitor connected between the reading node and a ground end;
  a precharging switch connected between the reading node and a power source, controlled by a precharging control signal $\phi p$ and configured to charge the capacitor; and
  an inverter to which the potential of the reading node is input to generate a digital signal;
 a reference data transfer line;
 a plurality of dummy cells connected to the reference data transfer line, respectively, each of the dummy cells having a constitution similar to that of the memory cell;
 a reference reading signal line which reads the signal from the reference data transfer line;
 a reference clamp transistor connected between the reference reading signal line and the reference data transfer line, the transistor being provided with a control input terminal to which the clamp voltage is supplied to fixedly hold a potential of the reference data transfer line; and
 the reference reading circuit being a reference reading circuit in which the hold switch of the reading circuit is short-circuited, the reading node of the reading circuit being connected to the reference reading signal line,
 a clock inverting inverter circuit which inverts the bit output of an inverter of the reference reading circuit to output the control signal $\phi r$.

According to a further another aspect of the present invention, there is provided a magnetic storage device comprising:
 a plurality of bit lines arranged in parallel along one direction;
 a reference bit line arranged in parallel with the bit lines;

a plurality of word lines arranged in parallel in a direction crossing the bit lines and the reference bit line;

a plurality of memory cells each comprising a magnetic change type resistance element in which an electric resistance changes in accordance with a magnetized state and a selection transistor, which are connected in series, and arranged in intersecting portions between the bit lines and the word lines, respectively, one end of each memory cell being connected to the bit line, the other end thereof being connected to a ground end, a gate of the selection transistor being connected to the word line;

a reading signal line which reads a signal from the bit line;

a clamp transistor provided for each of the bit lines, connected between the reading signal line and the bit line, and provided with a control input terminal to which a clamp voltage is supplied to fixedly hold a potential of the bit line;

a reading circuit which reads the signal from the bit line, the reading circuit including:

a reading node which reads the signal from the reading signal line;

a hold switch connected between the reading node and the reading signal line, controlled by a reading control signal φr and configured to hold the potential of the reading node;

a capacitor connected between the reading node and a ground end;

a precharging switch connected between the reading node and a power source, controlled by a precharging control signal φp and configured to charge the capacitor; and    an inverter to which the potential of the reading node is input to generate a digital signal;

a plurality of dummy cells each comprising a magnetic change type resistance element in which an electric resistance changes in accordance with a magnetized state and a selection transistor, which are connected in series, and arranged in intersecting portions between the reference bit lines and the word lines, respectively, one end of each dummy cell being connected to the reference bit line, the other end thereof being connected to the ground end, a gate of the selection transistor being connected to the word line;

a reference reading signal line which reads the signal from the reference bit line;

a reference clamp transistor connected between the reference reading signal line and the reference bit line, and provided with a control input terminal to which the clamp voltage is supplied to fixedly hold a potential of the reference bit line; and the reference reading circuit which reads the signal from the reference bit line, the reference reading circuit including:

a capacitor connected between the reference reading signal line and the ground end;

a precharging switch connected between the reference reading signal line and the power source, controlled by the precharging control signal φp, and configured to charge the capacitor; and    an inverter to which a potential of the reference reading signal line is input to generate a digital signal; and    a clock inverting inverter circuit which inverts a bit output of the inverter of the reference reading circuit to output the control signal φr.

DETAILED DESCRIPTION OF THE INVENTION

The present invention will hereinafter be described in detail in accordance with embodiments with reference to the drawings.

First Embodiment

Figure 1:
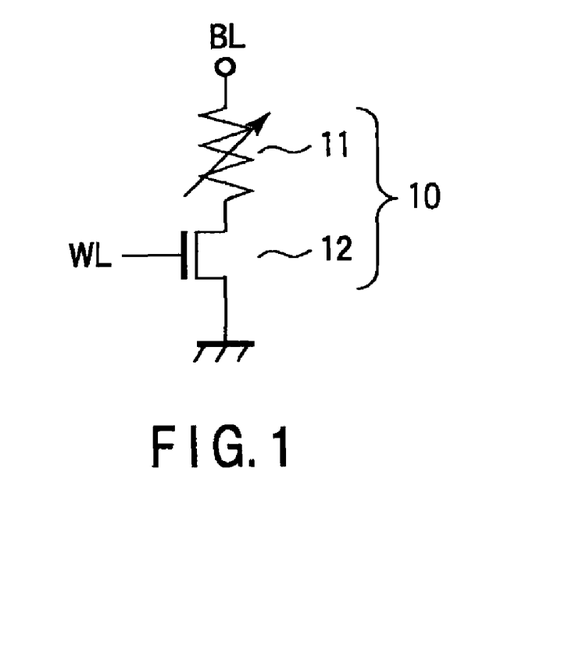
FIG. 1 is an equivalent circuit diagram showing a constitution of an MRAM cell.

As shown in FIG. 1, a magneto-resistance random access memory (MRAM) cell 10 in which a resistance value changes in accordance with storage information is constituted by connecting a magnetic change type resistance element 11 referred to as a magnetic tunneling junction (MTJ) and a selection transistor 12 for cell selection in series. One end of the MTJ 11 (on a side opposite to the transistor 12) is connected to a bit line BL as a data transfer line. A gate terminal of the transistor 12 is connected to a word line WL for the cell selection, a drain end thereof is connected to the MTJ 11, and a source end thereof is connected to the ground. It is to be noted that, although not shown, the MRAM cells 10 are two-dimensionally arranged in a row direction and a column direction. Furthermore, the cells of the same row are connected to the same bit lines BL, and the cells of the same column are connected to the same word lines WL.

Figure 2:
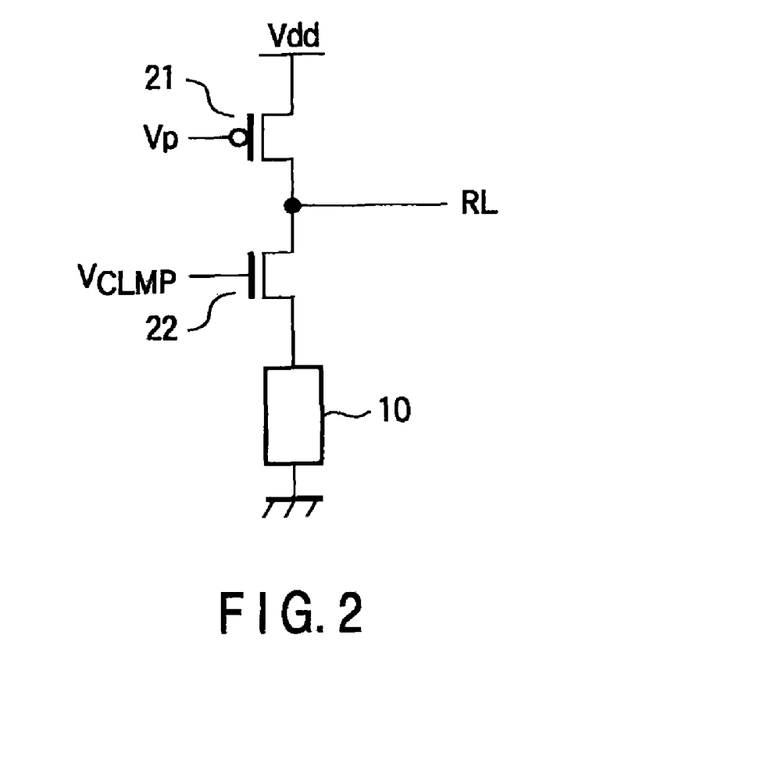
FIG. 2 is a diagram showing a circuit constitution for applying a constant voltage to a data transfer line.

As shown in FIG. 2, a reading signal line RL for reading data from the MRAM cell 10 is connected to a circuit in which a constant voltage is applied to a plurality of MRAM cells 10 connected in common to the data transfer line. That is, a switch 21 and a clamp transistor 22 are connected in series between a power source end and the MRAM cell 10. The reading signal line RL is connected to a connecting portion between the switch 21 and the clamp transistor 22. To a gate of the clamp transistor 22, a clamp voltage is supplied. The clamp transistor 22 constantly holds a potential of the data transfer line in a state in which the switch 21 is turned on. Furthermore, the reading circuit is configured to read the output of this constant voltage circuit.

In such a circuit, the signal is read by detecting a current corresponding to the resistance value which changes in accordance with the storage state of the MRAM cell 10. Furthermore, it is judged whether the current is large or small, thereby deciding "1" or "0".

Figure 3:
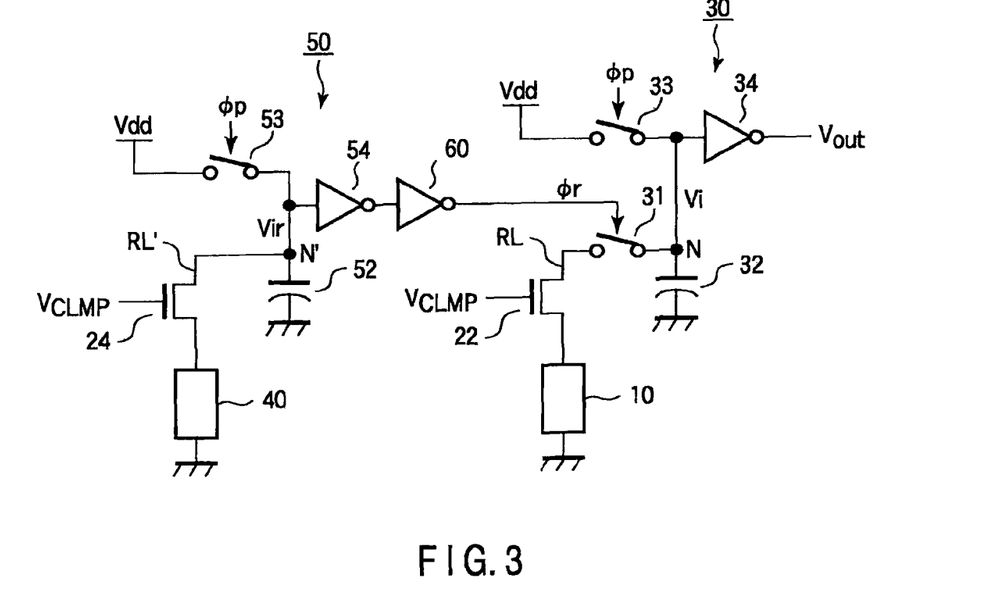
FIG. 3 is a circuit constitutional diagram showing a magnetic storage device according to a first embodiment.

As shown in FIG. 3, a magnetic storage device according to a first embodiment of the present invention is characterized by providing a capacity discharge type MRAM reading circuit having a holding function.

The magnetic storage device of the present embodiment is constituted of the MRAM cell 10, the clamp transistor 22, a clamp transistor 24, a signal reading circuit 30, a dummy cell 40, a reading circuit 50 for reference and a clock inverting inverter circuit 60.

As shown in FIG. 1 described above, the MRAM cell 10 is constituted by connecting the magnetic change type resistance element 11 and the selection transistor 12 in series. The clamp transistor 22 is connected between the data transfer line (the bit line BL) connected to the MRAM cell 10 and the reading signal line RL. The clamp transistor 22 is controlled by a clamp signal $V_{CLMP}$ given from the outside. Then, this clamp transistor 22 can apply a constant voltage to the MRAM cell 10.

It is to be noted that although not shown, the MRAM cells 10 are two-dimensionally arranged in the row direction and the column direction to constitute an MRAM array. More specifically, the MRAM cells 10 are arranged in intersecting portions between a plurality of bit lines BL arranged in parallel in the row direction and a plurality of word lines WL arranged in parallel in the column direction. Then, the ends of the MRAM cells 10 of the same row on one side are connected in common to the bit line BL, and the gates of the selection transistors 12 of the MRAM cells 10 in the same column are connected in common to the word line WL.

A signal reading circuit 20 is constituted of a hold switch 31 connected between the reading signal line RL and a reading node N, a capacitor 32 connected between the reading node N and a ground end, a precharging switch 33 connected between the reading node N and the power source end, and an inverter 34 in which the potential of the reading node N is input to generate a digital signal.

The hold switch 31 is controlled by a reading control signal φr having the binary voltage state of a power source voltage and a ground voltage. Then, a circuit turns on at a time when the signal φr is a power source signal, and the circuit turns off at a time when the signal φr is a ground signal. This circuit may be constituted of one pMOS transistor or one nMOS transistor. When one nMOS transistor constitutes the switch and the switch has a large input voltage, the resistance value increases considerably and the response time is decrease. To avoid this problem, it is possible to use a switch that enable a constant resistance value to be obtained over the whole input voltage range of the power source voltage to the ground voltage. That is, the switch may be a circuit in which the nMOS transistor and the pMOS transistor are connected in parallel.

The precharging switch 33 is a circuit controlled by a precharging control signal φp having the binary voltage state of the power source voltage and the ground voltage. Then, the circuit turns on at a time when the signal φp is a power source signal, and the circuit turns off at a time when the signal φp is a ground signal. As this circuit, a circuit similar to the hold switch 31 may be used.

In the inverter 34, the voltage of one end (the node N) of the capacitor 32 is an input signal, and the reverse voltage of the input signal is output. The output voltages of the inverter 34 are the power source voltage and the ground voltage. The inverter 34 outputs the ground voltage at a time when the input signal is about ½ of the power source voltage or more, and the inverter outputs the power source voltage at a time when the signal is below half of the power source voltage.

The dummy cell 40 has a constitution substantially similar to that of the MRAM cell 10. The clamp transistor 24 is connected between a reference data transfer line (the dummy bit line) connected to the dummy cell 40 and a reading signal line RL' for reference. In the same manner as the clamp transistor 22, the clamp transistor 24 is controlled by the clamp signal $V_{CLMP}$ given from the outside, whereby a constant voltage is applied to the dummy cell 40.

The reading circuit 50 for reference has a constitution in which the hold switch 31 of the reading circuit 30 is short-circuited. That is, the circuit is constituted of a capacitor 52 connected between a reading signal line for reference (a reading node N') and the ground end, a precharging switch 53 connected between the reading node N' and the power source end, and an inverter 54 in which the potential of the reading node N' is input to generate the digital signal. Then, the bit output of the reading circuit 50 for reference is inverted by the clock inverting inverter circuit 60, and this output is supplied as the control signal φr to the hold switch 31 of the reading circuit 30.

Figure 4:
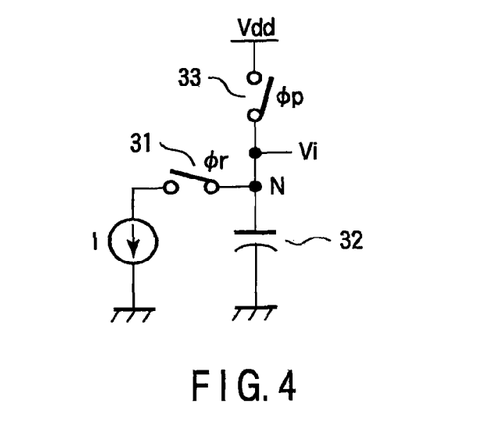
FIG. 4 is a circuit constitutional diagram for explaining the principle of capacity discharge in the first embodiment.

Here, to understand the principle of the current-voltage conversion using the capacitor, a circuit of FIG. 4 is assumed. This circuit is constituted of the switch 31, the capacitor 32, the switch 33 and a constant current source having one end connected to the ground. The hold switch 31 is connected to the node N and the other end of the constant current source, and is controlled to open and close by the control signal φr. The capacitor 32 is connected between the node N and the ground. The switch 33 is connected between the node N and the power source end, and is controlled to open and close by the control signal φp. The capacity of the capacitor 32 is C, and the current value of the constant current source is I.

Figure 5:
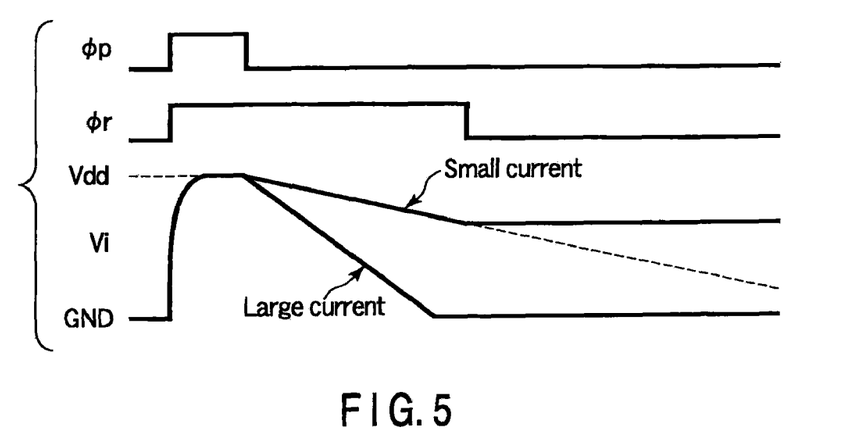
FIG. 5 is a diagram showing a change of an output voltage Vi to a change of time, in which a current is a parameter.
Figure 6A:
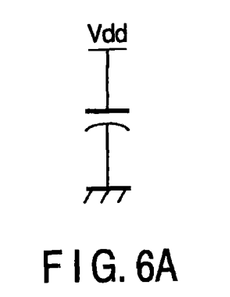
FIGS. 6A and 6B are diagrams showing circuit states in precharge and discharge of the circuit of FIG. 4.

A relation between the control signals φp, φr and an output voltage Vi of the capacitor (the voltage of the node N) in the circuit of FIG. 4 is shown in a timing chart of FIG. 5. First, the signal φp is switched to the power source voltage (on), and the switch 33 is turned on to set the node N to the power source voltage. At this time, the signal φr is grounded (off), the switch 31 is turned off, and the node N is cut from the constant current source. When this operation is performed, an electric charge is accumulated in the capacitor 32. The amount of the charge is:

$$Q = C \times Vdd,$$

where Q is the charge accumulated in the capacitor 32 (FIG. 6A, precharging).

Figure 6B:
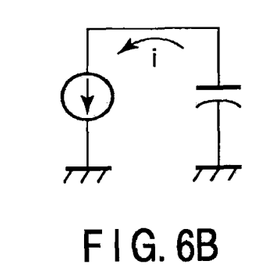

Subsequently, the signal φr is turned on, then the signal φp is turned off, the node N is connected to the constant current source and the node N is disconnected from the power source. At this time, the charge accumulated in the capacitor 32 is discharged with the constant current source (FIG. 6B, discharging), and the voltage of the node N lowers.

$$Qd = I \times T,$$

where Qd is the amount of the charge to be discharged, and T is the discharge time The voltage of the node N can be calculated as follows:

$$Vi = Q/C.$$

In consequence, the following voltage is obtained after discharging the charge accumulated in the capacitor 32 at current I for time T:

$$Vi = (Q - Qd)/C$$
$$= (C \times Vdd - I \times T)C$$
$$= Vdd - (I \times T)/C$$

The change of the voltage of the node N changes in accordance with the current, the capacity value and the discharge time from the above equation. That is, as shown in FIG. 5, it is seen that the voltage of the node N decreases with an elapse of time and that the change amount depends on the current amount.

When the switch 31 controlled by the signal φr is turned off, the current source for discharging the capacitor 32 is disconnected. Therefore, as shown in FIG. 5, the capacitor 32 stores (holds) intermediate charge information. The circuit of FIG. 4 repeatedly performs a series of the above precharging, discharging and holding flows.

The reading circuit of the magnetic storage device shown in FIG. 3 is basically constituted of the circuit of FIG. 4. In the reading circuit 30 used in the present embodiment, the constant current source of the circuit of FIG. 4 corresponds to the reading current of the MRAM cell 10. The reading current varies in accordance with a cell storage state, and the reaching time of the discharge voltage Vi to the ground voltage changes between the case where the cell 10 has a low resistance and the case where it has a high resistance. The output signal of the reading circuit 30 is digitized by the inverter 34. The capacity value of the capacitor 32 for use in the reading circuit 30 is determined in consideration of the reading time of the cell 10 and the current value of the cell 10 so that the voltage becomes smaller than Vdd/2 within the reading time of the cell 10.

The control signal φr of the switch 31 connected to the capacitor 32 is generated by a capacity discharge circuit for reading the dummy cell 40. As shown in FIG. 3 described above, the reference reading circuit 50 for reading the dummy cell 40 is substantially the same as the cell reading circuit 30, but has different reading cell characteristics. The output current of the dummy cell 40 is about half of the two current outputs in the high resistance state and the low resistance state. As an output Vir of a reference voltage, a reverse signal with respect to the control signal φr is output. Therefore, the inverter circuit 60 which further inverts this output is provided, and the output of this inverter circuit 60 is output as the control signal φr.

Figure 7:
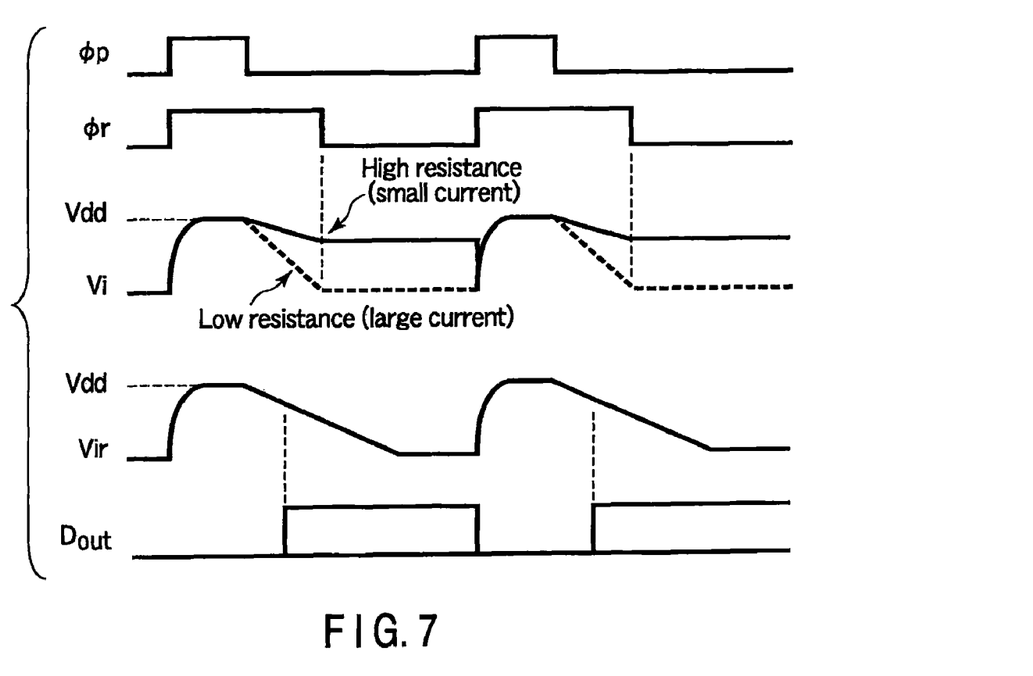
FIG. 7 is a timing chart for explaining the operation of a reading circuit, for an MRAM by capacity discharge, having a holding function in the first embodiment.

FIG. 7 shows a timing chart of a reading operation in the present embodiment. First, the switch φp is switched to the power source voltage (turned on) to perform a precharging operation. Next, the switch φr is switched to the power source voltage (turned on), and then the switch φp is turned off (grounded) to perform a discharging operation. Finally, the switch φr is turned off (grounded) to perform a holding operation. At this time, as an output signal (the potential of the node N) Vout, a value smaller than Vdd/2 is held in a case where the MRAM cell 10 has low resistance, and a value larger than Vdd/2 is held in a case where the MRAM cell 10 has a high resistance. This Vout output is received to digitize the signal by the inverter 34.

The above operation is repeatedly performed to read a plurality of MRAM cells connected to the same line. That is, the selection of the word line WL is successively switched, and the above scanning is performed to successively read the storage information of the MRAM cells 10 connected to the same bit line BL.

Thus, according to the present embodiment, the reading circuit is constituted as shown in FIG. 3, whereby the storage information of the MRAM cell 10 can be read by a capacity discharge system. Therefore, in this case, the following advantages are obtained as compared with a conventional method.

In a conventional reading system, to compare the reference voltage with the voltage Vout and to hold a digital value indicating the comparison result, a comparison circuit and a latch circuit are necessary. On the other hand, in the present embodiment, the switch 31 which turns off the capacity discharge is provided to store the voltage Vout. That is, the holding function, which has heretofore been necessary, is not performed with respect to the digital signal, and is performed with respect to an analog signal. In consequence, the latch circuit becomes unnecessary, and the area of the circuit can be decreased.

Moreover, as shown in FIG. 7, after the holding, Vout is the voltage around the ground at a time when the MRAM cell 10 has the low resistance state, and is the voltage around Vdd at a time when the cell has the high resistance state. Therefore, these two analog values may be judged. In consequence, in the present circuit, the reading circuit can be realized using the inverter 34 having a judgment voltage of about Vdd/2 instead of a complicated comparator. Therefore, as compared with a case where the complicated comparator is used, the area of the circuit can be decreased.

That is, when the capacity discharge circuit is provided with the holding function, a latched comparator function can be realized merely by the switch and the inverter circuit. Therefore, the area of the reading circuit can be decreased, and power consumption can be lowered.

Second Embodiment

The reading circuit 30 for use in the first embodiment might be influenced by the fluctuation of a manufacturing process. In particular, when the fluctuation of the judgment voltage of the inverter 34 is generated, an MRAM process margin is largely influenced.

The process margin is critical for relieving the influence on the process fluctuation of the MRAM cell 10. A relation between the process fluctuation of the inverter 34 and the process margin will hereinafter be described with reference to FIGS. 8 and 9.

The inverter 34 is a 1-bit A/D converter which receives a voltage Vi to be held at a time when the hold switch 31 is turned off and which judges whether this voltage is not less than Vdd/2 or not more than Vdd/2, to determine an output. The judgment voltage of the inverter 34 is determined in accordance with the balance of the characteristics of pMOS and nMOS transistors constituting this circuit. The input/output characteristics shown by a solid line in FIG. 8 depict the state in which both the transistors have the same characteristic and the judgment voltage is Vdd/2.

Figure 8:
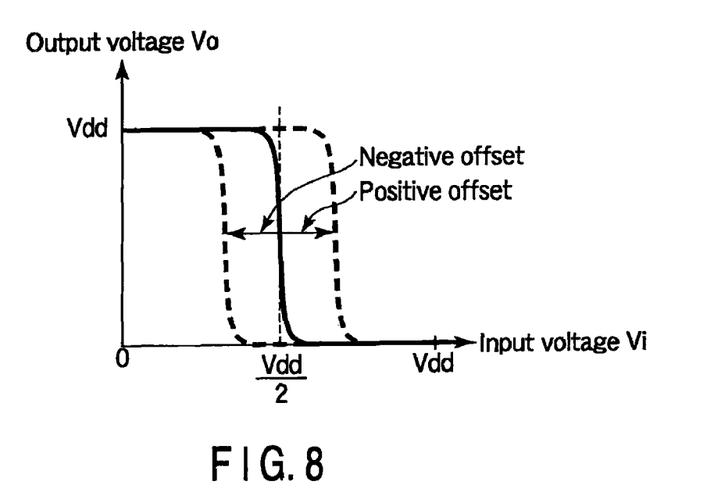
FIG. 8 is a diagram showing input/output characteristics of an inverter circuit.

However, when the balance of both the transistors collapses owing to a process fluctuation, the input/output characteristics are shown by a broken line in FIG. 8, and a positive or negative offset is generated in the judgment voltage. That is, the judgment voltage changes from an ideal, Vdd/2, to a voltage in which the offset voltage has been added to Vdd/2.

Figure 9:
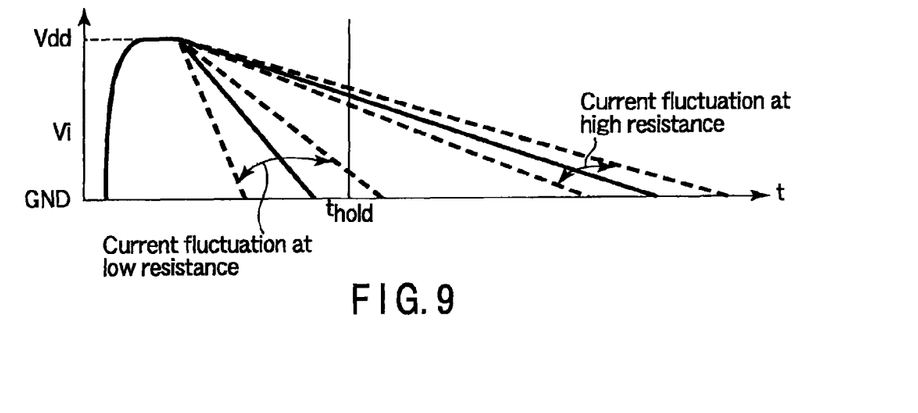
FIG. 9 is a diagram showing the change of a discharge voltage Vi due to the fluctuation of the current of the MRAM cell.

Next, the change of a discharge voltage Vi at a time when the process fluctuation is generated in the MRAM cell 10 will be described. In FIG. 9, solid lines show voltage change characteristics in a state in which no process fluctuation is present, and broken lines show voltage change characteristics at a time when a process fluctuation is generated. Owing to the influence of the process fluctuation, the reading current of the MRAM cell 10 fluctuates, and the voltage of the node N changes. It is seen that, assuming that the hold time is $t_{hold}$, a voltage difference between the low resistance and the high resistance changes owing to the generation of the process fluctuation.

This voltage difference is a necessary margin for the inverter 34 to output a secure digital signal. When the judgment voltage of the inverter 34 is ideal Vdd/2, the margin at the low resistance is equal to that at the high resistance. However, when a process fluctuation is generated in the inverter 34, a deviation is generated in the margins at low and high resistances. Since the process margin is restricted by the worst case, the MRAM process margin eventually deteriorates owing to the change of the judgment voltage of the inverter 34.

The present embodiment is characterized in that the reading circuit is provided with an offset cancel function to cancel the influence of the fluctuation of this judgment value.

Figure 10:
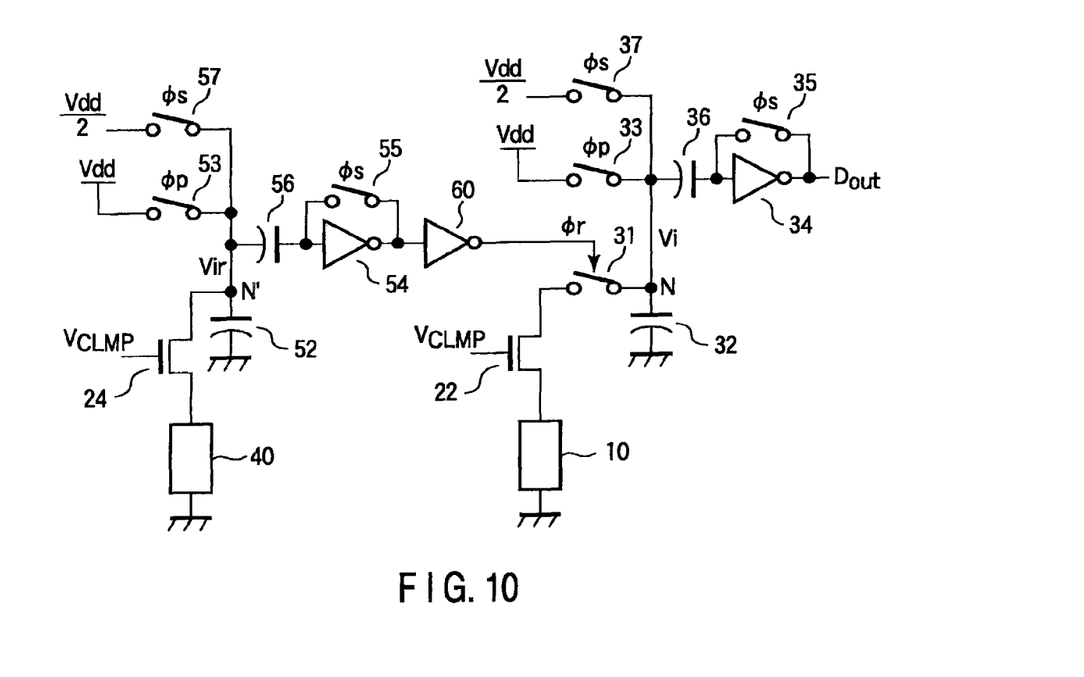
FIG. 10 is a circuit constitutional diagram showing a magnetic storage device according to a second embodiment.
Figure 11:
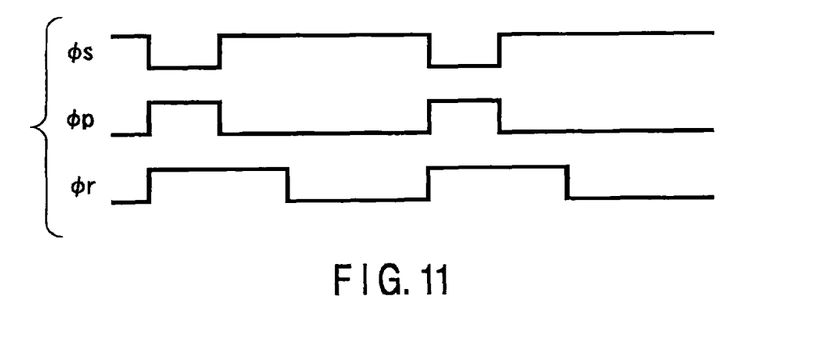
FIG. 11 is a timing chart showing the control signal of the reading circuit having an offset cancel function.

FIG. 10 shows a circuit constitutional diagram according to the second embodiment of the present invention, and FIG. 11 shows an operation timing chart. It is to be noted that the same parts as those of FIG. 3 are denoted with the same reference numerals, and detailed description thereof is omitted.

The basic constitution is similar to that of the first embodiment, but the present embodiment is different from the above first embodiment in that a reading circuit 30 is provided with a switch 35, a capacitor 36 and a switch 37, and a reading circuit 50 for reference is provided with a switch 55, a capacitor 56 and a switch 57.

Specifically, the switch 35 is connected between an input end and an output end of an inverter 34, the capacitor 36 as a coupling capacity is connected between the input end of the inverter 34 and a node N, and the switch 37 is connected between the node N and a power source. Similarly, the switch 55 is connected between an input end and an output end of an inverter 54, the capacitor 56 as a coupling capacity is connected between the input end of the inverter 54 and a node N', and the switch 57 is connected between the node N' and the power source. Then, the switches 35, 37, 55 and 57 are controlled by a control signal φs as a reverse signal of a control signal φp.

Figure 12A:
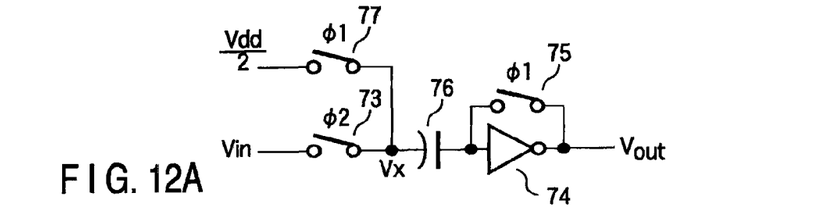
FIG. 12A is a circuit constitutional diagram for explaining the principle of the offset cancel of an inverter.
Figure 12B:
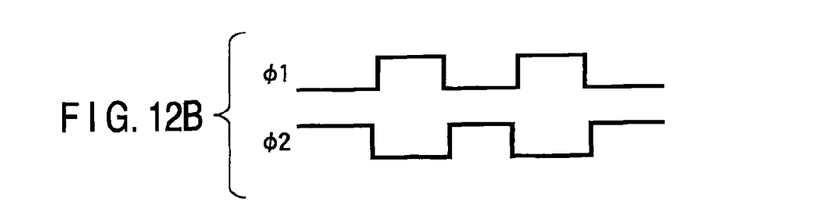
FIG. 12B is a timing chart for explaining the principle of the offset cancel of the inverter.

The principle of offset cancel in the reading circuit 30 used in the present embodiment will be described with reference to FIGS. 12A and 12B. FIG. 12A illustrates a part of the reading circuit 30, discharged with the magnetic storage device in FIG. 10.

The circuit of FIG. 12A is constituted of an inverter 74, a switch 75 which short-circuits input/output terminals of the inverter 74, a coupling capacitor 76 to be connected to an input end of the inverter 74, a switch 77 which connects one end of the coupling capacitor 76 to a power source voltage, and a switch 73 to be connected to an input signal Vin.

The switches 73, 75 and 77 in the circuit of FIG. 12A are controlled by control clocks φ1, φ2 which do not overlap with each other. When the clock φ1 turns on and the clock φ2, a short-circuit occurs between an input and an output in the inverter of the circuit, and one end of the capacitor 76 connected to the input end of the inverter 74 is connected to Vdd/2. The short voltage of the inverter 74 corresponds to the judgment voltage of the inverter 74. The judgment voltage is as follows:

$$Vinv\_th = Vdd/2 + Voff,$$

where Vinv_th is the judgment voltage and Voff is an offset voltage generated owing to fluctuation.

On the other hand, charge Qr stored in the inverter 74 is represented by the following equation:

$$Qr = C \times (Vdd/2 - Vinv\_th),$$

where C is a capacity value.

Next, when the clock φ1 is turned off and the clock φ2 is turned on, the voltage Vi before discharging the charge stored in the inverter 74 is as follows:

$$Vi = Vin + \Delta Vc$$
$$= Vin + Qr/C$$
$$= Vin + VDD/2 - Vinv\_th$$
$$= Vin + VDD/2 - VDD/2 + Voff$$
$$= Vin + Voff,$$

provided that no parasitic capacity of a switch to be controlled by the parasitic capacity of an inverter and φ2 is present.

When the input signal Vin is, for example, 0V, the offset voltage Voff of the inverter is added to the input signal Vi of the inverter. Even if an offset voltage is present in the inverter circuit, the input voltage of the inverter circuit is automatically set to the central value of the judgment voltage. That is, even if an offset voltage of the inverter is generated, the inverter circuit operates depending on whether the input voltage is larger or smaller than 0V.

In the magnetic storage device shown in FIG. 10, the above fundamental technology is applied to the inverter 34 of the reading circuit 30. This device has a constitution in which the switch 35 for short-circuiting the inverter input and output ends is provided and in which the coupling capacitor 36 is inserted to the input side of the inverter circuit. Thus, according to this constitution, the offset voltage of the inverter circuit can automatically be canceled. Furthermore, in the same manner as the reading circuit 30, in the reading circuit 50 for reference, the switch 55, the capacitor 56 for coupling and the like are inserted, whereby the offset voltage can automatically be canceled.

That is, the switches 33, 35 and 37 and 53, 55 and 57 of FIG. 10 correspond to the switches 73, 75 and 77 of FIG. 12A, the inverters 34, 54 of FIG. 10 correspond to the inverter 74 of FIG. 12A, and the capacitors 36, 56 of FIG. 10 correspond to the capacitor 76 of FIG. 12A. Moreover, φs of FIG. 11 corresponds to φ1 of FIG. 12B, and φp of FIG. 11 corresponds to φ2 of FIG. 12B.

Thus, according to the present embodiment, needless to say, an effect similar to that of the above first embodiment can be obtained. Moreover, the offset of the inverter circuit can be canceled, and a large margin due to the process fluctuation can be obtained.

Third Embodiment

Figure 13:
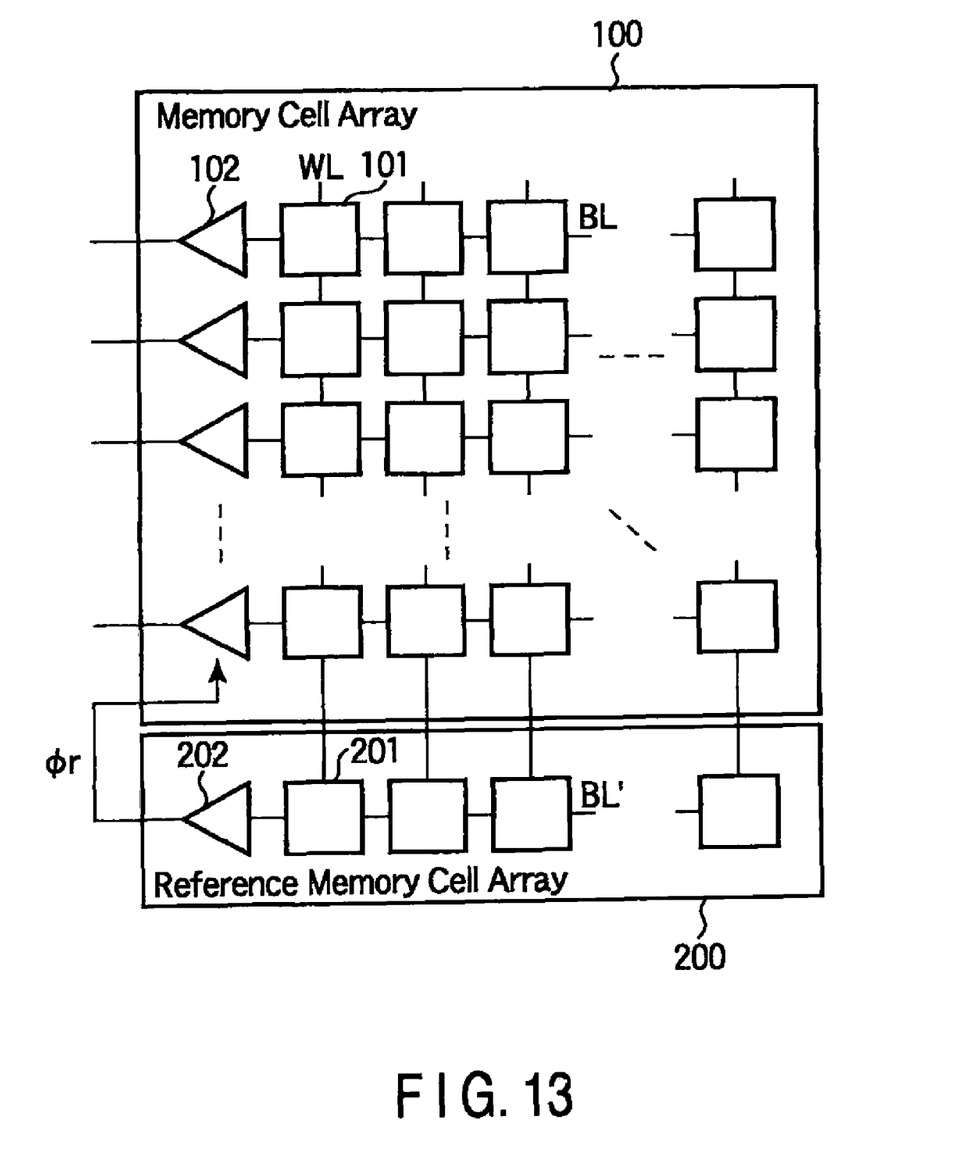
FIG. 13 is a plan view showing the schematic constitution of a magnetic storage device according to a third embodiment.

A third embodiment of the present invention will be described with reference to FIG. 13.

On the same chip, a memory cell array portion 100 is arranged adjacent to a dummy cell array portion 200. In the memory cell array portion 100, a plurality of bit lines BL are arranged in a row direction. In the dummy cell array portion 200, one reference bit line BL' is arranged along the row direction. A plurality of word lines WL are arranged to straddle the memory cell array portion 100 and the dummy cell array portion 200 in a column direction.

In the memory cell array portion 100, MRAM cells 101 are arranged in intersecting portions between the bit lines BL and the word lines WL, respectively. Each of the MRAM cells 101 is constituted by connecting a magnetic change type resistance element and a selection transistor in series as determined in the first embodiment. One end of the MRAM cell 101 is connected to the bit line BL, and a gate of the selection transistor is connected to the word line WL. A terminal end of the bit line BL is connected to a reading circuit 102. That is, one reading circuit 102 is arranged with respect to one bit line BL. This reading circuit 102 is similar to, for example, the reading circuit 30 used in the first embodiment.

In the dummy cell array portion 200, dummy cells 201 are arranged in intersecting portions between the reference bit line BL' and the word lines WL, respectively. That is, the dummy cells 201 are connected to one reference bit line BL' in the same manner as the MRAM cells 101 connected to one bit line BL. A terminal end of the reference bit line BL' is connected to a reading circuit 202 for reference. The reference reading circuit 202 has, for example, a constitution in which an inverter 60 has been added to the reference reading circuit 50 used in the first embodiment.

An output φr of the reference reading circuit 202 is supplied to the reading circuit 102. Then, in a case where storage information of the MRAM cell 101 selected by selecting the word line WL is read in the reading circuit 102, a control signal φr obtained by selecting the dummy cell 201 of the same column from the reference reading circuit 202 is given.

Thus, in the present embodiment, even in a structure in which a plurality of MRAM cells 101 are integrated along one bit line BL, one reading circuit 102 is provided with respect to these MRAM cells 101. In this case, a difference of reading current characteristics is generated between the MRAM cell 101 close to the reading circuit 102 and the MRAM cell 101 away from the reading circuit. For example, as compared with the close MRAM cell 101, in the far MRAM cell 101, a current needs to be supplied to the reading circuit 102 via a long wiring line. Therefore, in the far MRAM cell 101, the reading current decreases owing to the influence of the parasitic resistance of the wiring line, and a current offset is generated. The current offset is determined by the length of the wiring line provided the parasitic resistance is uniform.

In the present embodiment, the dummy cells 201 are provided along one reference bit line BL' in the same manner as the MRAM cells 101 along one bit line BL, and the dummy cell 201 of the same column is selected in a case where the storage information is read from the MRAM cell 101. In consequence, the above current offset can be cancelled. That is, when the dummy cell of the same column as that of the selected MRAM cell 101 is selected, a wiring line length to the selected MRAM cell 101 as viewed from the reading circuit 102 becomes equal to that to the selected dummy cell 201 as viewed from the reference reading circuit 202. In consequence, the change of the reading current due to the influence of the parasitic resistance of the wiring line can be canceled. Therefore, the deterioration of a process margin can be prevented.

(Modification)

It is to be noted that the present invention is not limited to the above embodiments as it is, and constitutional requirements can be modified and embodied without departing from the scope of the present invention in an implementation stage. For example, a magnetic change type resistance element constituting an MRAM cell is not limited to an MTJ, and may be an element in which a resistance value changes in accordance with a storage state. That is, it only has to be composed as a memory cell by using the magnetic substance. Moreover, appropriate combinations of a plurality of constitutional requirements disclosed in the embodiments can form various inventions. For example, several constitutional requirements may be removed from all the constitutional requirements described in the embodiments. Furthermore, the constitutional requirements of different embodiments may be appropriately combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic storage device comprising:
a data transfer line;
a plurality of memory cells connected to the data transfer line, each of the memory cells comprising a magnetic change type resistance element in which an electric resistance changes in accordance with a magnetized state and a selection transistor, which are connected in series;
a reading signal line which reads a signal from the data transfer line;
a clamp transistor connected between the reading signal line and the data transfer line, the transistor being provided with a control input terminal to which a clamp voltage is supplied to fixedly hold a potential of the data transfer line;
a reading circuit which reads the signal from the data transfer line, the reading circuit including:
a reading node which reads the signal from the reading signal line;
a hold switch connected between the reading node and the reading signal line, controlled by a reading control signal φr and configured to hold a potential of the reading node;
a capacitor connected between the reading node and a ground end;
a precharging switch connected between the reading node and a power source, controlled by a precharging control signal φp and configured to charge the capacitor; and
an inverter to which the potential of the reading node is input to generate a digital signal;
a reference data transfer line;
a plurality of dummy cells connected to the reference data transfer line, respectively, each of the dummy cells having a constitution similar to that of the memory cell;
a reference reading signal line which reads the signal from the reference data transfer line;
a reference clamp transistor connected between the reference reading signal line and the reference data transfer line, the transistor being provided with a control input terminal to which the clamp voltage is supplied to fixedly hold a potential of the reference data transfer line; and
the reference reading circuit being a reference reading circuit in which the hold switch of the reading circuit is short-circuited, the reading node of the reading circuit being connected to the reference reading signal line,
a clock inverting inverter circuit which inverts the bit output of an inverter of the reference reading circuit to output the control signal φr.

2. The device according to claim 1, wherein the memory cells are two-dimensionally arranged, connected to the same data transfer line in a row direction, and connected to the same word line in a column direction, and the dummy cells are arranged in the same manner as one row of the memory cells.

3. The device according to claim 2, wherein when the memory cell is selected and read, the dummy cell of the same column is selected.

4. The device according to claim 1, wherein the inverter inverts an output by use of the potential of ½ of a power source voltage as the threshold value of an input potential.

5. The device according to claim 1, wherein the memory cell changes to a high resistance state or a low resistance state in accordance with a storage state, the dummy cell is held in an intermediate state between the high resistance state and the low resistance state, and the inverter of the reference reading circuit is configured to invert a potential of its input end by use of ½ of a power source voltage as a threshold value.

6. The device according to claim 1, further comprising:

a switch which short-circuits input and output ends of the inverter to cancel an offset of the inverter of the reading circuit; and a coupling capacitor interposed between the input end of the inverter and the reading node.

7. The device according to claim 1, further comprising:

a switch which short-circuits input and output ends of the inverter to cancel an offset of the inverter of the reference reading circuit; and a coupling capacitor interposed between the input end of the inverter and the reference data transfer line or a reference bit line.

* * * * *